(12) United States Patent
Kanda (10) Patent No.: US 9,576,676 B2
(45) Date of Patent: Feb. 21, 2017

(54) SEMICONDUCTOR DEVICE AND METHOD OF WRITING DATA

(71) Applicant: Sony Semiconductor Solutions Corporation, Kanagawa (JP)

(72) Inventor: Yasuo Kanda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 85 days.

(21) Appl. No.: 14/553,398

(22) Filed: Nov. 25, 2014

(65) Prior Publication Data

US 2015/0194222 A1    Jul. 9, 2015

(30) Foreign Application Priority Data

Jan. 8, 2014   (JP) .................................. 2014-001805

(51) Int. Cl.
*G11C 17/14*   (2006.01)
*G11C 17/16*   (2006.01)
*G11C 17/18*   (2006.01)

(52) U.S. Cl.
CPC ............... *G11C 17/16* (2013.01); *G11C 17/18* (2013.01)

(58) Field of Classification Search
CPC ..................................................... G11C 17/14
USPC .......................................................... 365/96
See application file for complete search history.

(56) References Cited

U.S. PATENT DOCUMENTS

| | | | | |
|---|---|---|---|---|
| 6,639,863 | B2* | 10/2003 | Imamura ................ | G11C 29/02 257/E23.15 |
| 7,280,415 | B2* | 10/2007 | Hwang .................. | G11C 29/02 365/189.09 |
| 2009/0003093 | A1* | 1/2009 | Matsuo .................. | G11C 17/16 365/189.15 |
| 2012/0106259 | A1* | 5/2012 | Chih .................. | G11C 16/0483 365/185.22 |
| 2015/0318050 | A1* | 11/2015 | Huang .................. | G11C 17/16 365/96 |
| 2016/0020220 | A1* | 1/2016 | Li ..................... | H01L 27/11573 365/185.18 |

FOREIGN PATENT DOCUMENTS

| | | |
|---|---|---|
| JP | 2007-323786 | 12/2007 |
| JP | 2008-084454 | 4/2008 |

* cited by examiner

*Primary Examiner* — Min Huang
(74) *Attorney, Agent, or Firm* — Michael Best & Friedrich LLP (57) ABSTRACT

A semiconductor device includes: an electric fuse circuit including first electric fuses used as data bits and second electric fuses used as polarity bits; and a write circuit configured to selectively pass a current through the first electric fuses and the second electric fuses and thereby write data in the electric fuse circuit. The write circuit is configured to perform a first process when number of write bits included in write data is larger than a value obtained by dividing total number of bits in the write data by 2. The first process includes writing of inverted write data in a plurality of first electric fuses, and including writing of inversion data in one of the second electric fuses. The plurality of first electric fuses are part of the first electric fuses. The inverted write data is inverted data of the write data. The inversion data represents inversion.

13 Claims, 9 Drawing Sheets

BEFORE INVERSION PROCESS

| | DATA REGION | | | | | | | | POLARITY REGION | NUMBER OF WRITE BIT | a>ath? ath=4 |
|---|---|---|---|---|---|---|---|---|---|---|---|
| | BL0 | BL1 | BL2 | BL3 | BL4 | BL5 | BL6 | BL7 | BL8 | | |
| WL0 | 0 | 0 | 0 | 0 | 0 | 1 | 0 | 0 | 0 | 1 | NO |
| WL1 | 0 | 1 | 1 | 1 | 1 | 1 | 0 | 0 | 0 | 5 | YES |
| WL2 | 1 | 1 | 1 | 1 | 1 | 0 | 1 | 1 | 0 | 7 | YES |
| WL3 | 0 | 1 | 1 | 0 | 1 | 1 | 0 | 0 | 0 | 4 | NO |

TOTAL 17

FIG. 3

AFTER INVERSION PROCESS

| | DATA REGION | | | | | | | | POLARITY REGION | NUMBER OF WRITE BIT |
|---|---|---|---|---|---|---|---|---|---|---|
| | BL0 | BL1 | BL2 | BL3 | BL4 | BL5 | BL6 | BL7 | BL8 | |
| WL0 | 0 | 0 | 0 | 0 | 0 | 1 | 0 | 0 | 0 | 1 |
| WL1 | 1 | 0 | 0 | 0 | 0 | 0 | 1 | 1 | 1 | 4 |
| WL2 | 0 | 0 | 0 | 0 | 0 | 1 | 0 | 0 | 1 | 2 |
| WL3 | 0 | 1 | 1 | 0 | 1 | 1 | 0 | 0 | 0 | 4 |

TOTAL 11

SEMICONDUCTOR DEVICE AND METHOD OF WRITING DATA

CROSS REFERENCE TO RELATED APPLICATIONS

This application claims the benefit of Japanese Priority Patent Application JP 2014-001805 filed Jan. 8, 2014, the entire contents of which are incorporated herein by reference.

BACKGROUND

The present technology relates to a semiconductor device that includes a plurality of electric fuses, and to a method of writing data in such a semiconductor device.

Recently, there has been proposed a semiconductor device that uses a plurality of electric fuses as storage elements. The electric fuse may be, for example, a semiconductor element having an MOS (Metal Oxide Semiconductor) structure. In such a semiconductor device, application of a necessary current to the semiconductor element may cause, for example, EM (Electro Migration) of polysilicon silicide or dissolution of polysilicon. As a result, a resistance value is varied and data is thus stored in a non-volatile manner. The above-described semiconductor device stores data by irreversibly varying element characteristics of the electric fuse. Due to such properties, data is allowed to be programmed in the above-described semiconductor device only once, and the above-described semiconductor device is therefore called an OTP (One Time Programmable) memory. The OTP memory utilizing the electric fuse is typically used assuming that data of "0" is stored in the electric fuse before EM that has low resistance, and data of "1" is stored in the electric fuse after EM that has high resistance.

A memory that utilizes the irreversibility of the element characteristics as described above is disclosed, for example, in Japanese Unexamined Patent Application Publication Nos. 2008-84454 and 2007-323786.

SUMMARY

In an OTP memory utilizing an electric fuse, variation in resistance values is sequentially caused one bit by one bit when writing data. This has resulted in an issue that data writing time increases in proportion to memory capacity.

It is desirable to provide a semiconductor device and a method of writing data that are capable of suppressing increase in data writing time.

According to an embodiment of the present technology, there is provided a semiconductor device including: an electric fuse circuit and a write circuit. The electric fuse circuit includes a first plurality of first electric fuses and a plurality of second electric fuses. The first plurality of first electric fuses are configured to be used as data bits, and the plurality of second electric fuses are used as polarity bits. The write circuit is configured to selectively pass a current through the first plurality of first electric fuses and the plurality of second electric fuses and thereby write data in the electric fuse circuit. The write circuit is configured to perform a first process when number of write bits included in write data is larger than a value obtained by dividing total number of bits in the write data by 2. The first process includes writing of inverted write data in a second plurality of first electric fuses, and includes writing of inversion data in one of the plurality of second electric fuses included in the electric fuse circuit. The second plurality of first electric fuses are part of the first plurality of first electric fuses included in the electric fuse circuit. The inverted write data is inverted data of the write data. The inversion data represents inversion.

According to an embodiment of the present technology, there is provided a method of writing data, the method including, when number of write bits included in write data is larger than a value obtained by dividing total number of bits in the write data by 2, selectively passing a current through a second plurality of first electric fuses and thereby writing inverted write data in the second plurality of first electric fuses, as well as passing a current through one of a plurality of second electric fuses and thereby writing inversion data in the one of the plurality of second electric fuses. The second plurality of first electric fuses are part of a first plurality of first electric fuses. The first plurality of first electric fuses and the plurality of second electric fuses are included in an electric fuse circuit. The first plurality of first electric fuses are configured to be used as data bits. The plurality of second electric fuses are configured to be used as polarity bits. The inverted write data is inverted data of the write data. The inversion data represents inversion.

In the semiconductor device and the method of writing data according to the embodiments of the present technology, in the electric fuse circuit, the plurality of polarity bits are allocated to the first plurality of data bits, and one polarity bit is allocated to the second plurality of data bits that are part of the first plurality of data bits in the electric fuse circuit. This reduces data writing time compared to a case where polarity inversion is not performed. Also, even when polarity inversion is performed, data writing time is reduced compared to a case where only one polarity bit is provided in the electric fuse circuit.

According to the semiconductor device and the method of writing data according to the embodiments of the present technology, data writing time is reduced compared to the case where polarity inversion is not performed, the case where polarity inversion is performed and only one polarity bit is provided in the electric fuse circuit, etc. Accordingly, it is possible to suppress increase in the data writing time. Effects of the present technology is not necessarily limited to the effect described above and may be any of effects described herein.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

An embodiment of the present technology is described below in detail referring to the drawings. The description is provided in the following order.
1. Embodiment (Semiconductor Device)
2. Modification (Semiconductor Device)
3. Application Example (Semiconductor Integrated Circuit)

1. Embodiment

Configuration

Figure 1:
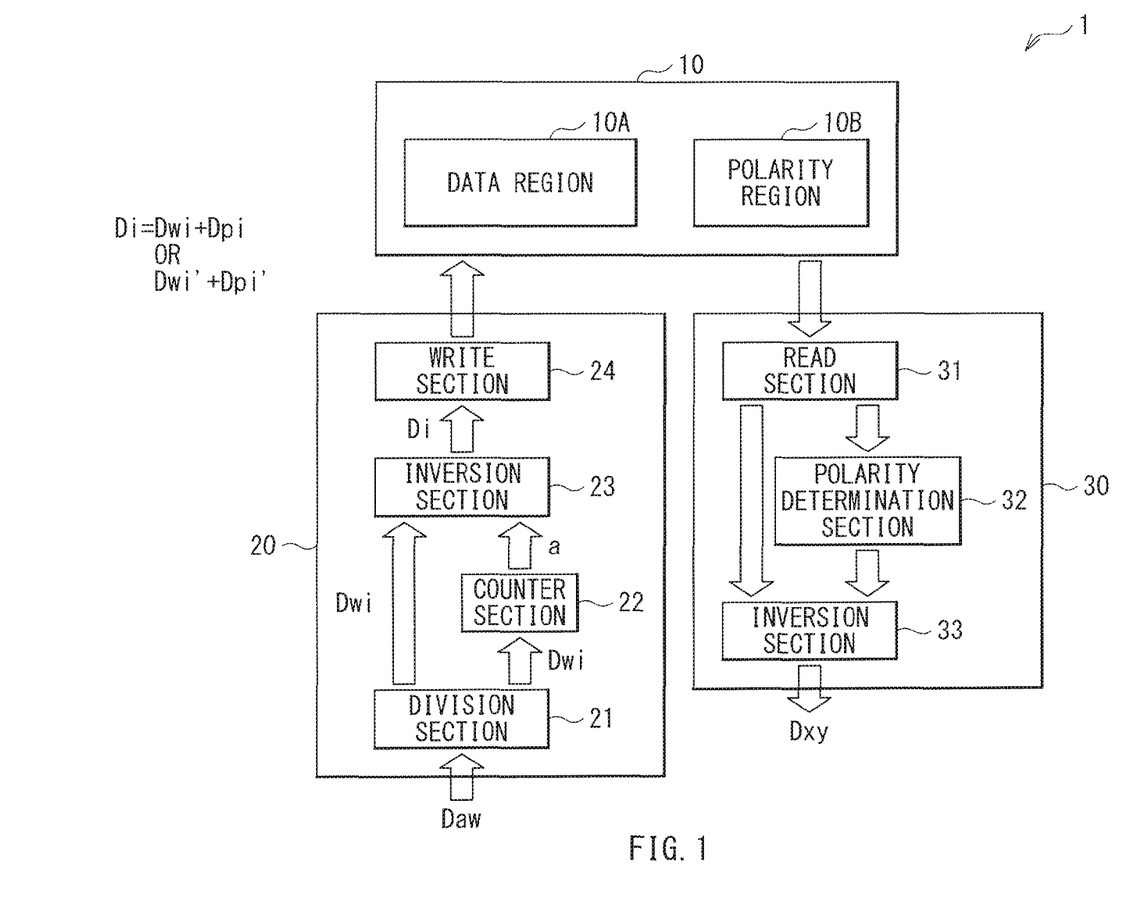
FIG. 1 is an outline configuration diagram of a semiconductor device according to an embodiment of the present technology.

FIG. 1 illustrates an outline configuration of a semiconductor device 1 according to an embodiment of the present technology. The semiconductor device 1 includes an electric fuse circuit 10, a write circuit 20, and a read circuit 30.
[Electric Fuse Circuit 10]

Figure 2:
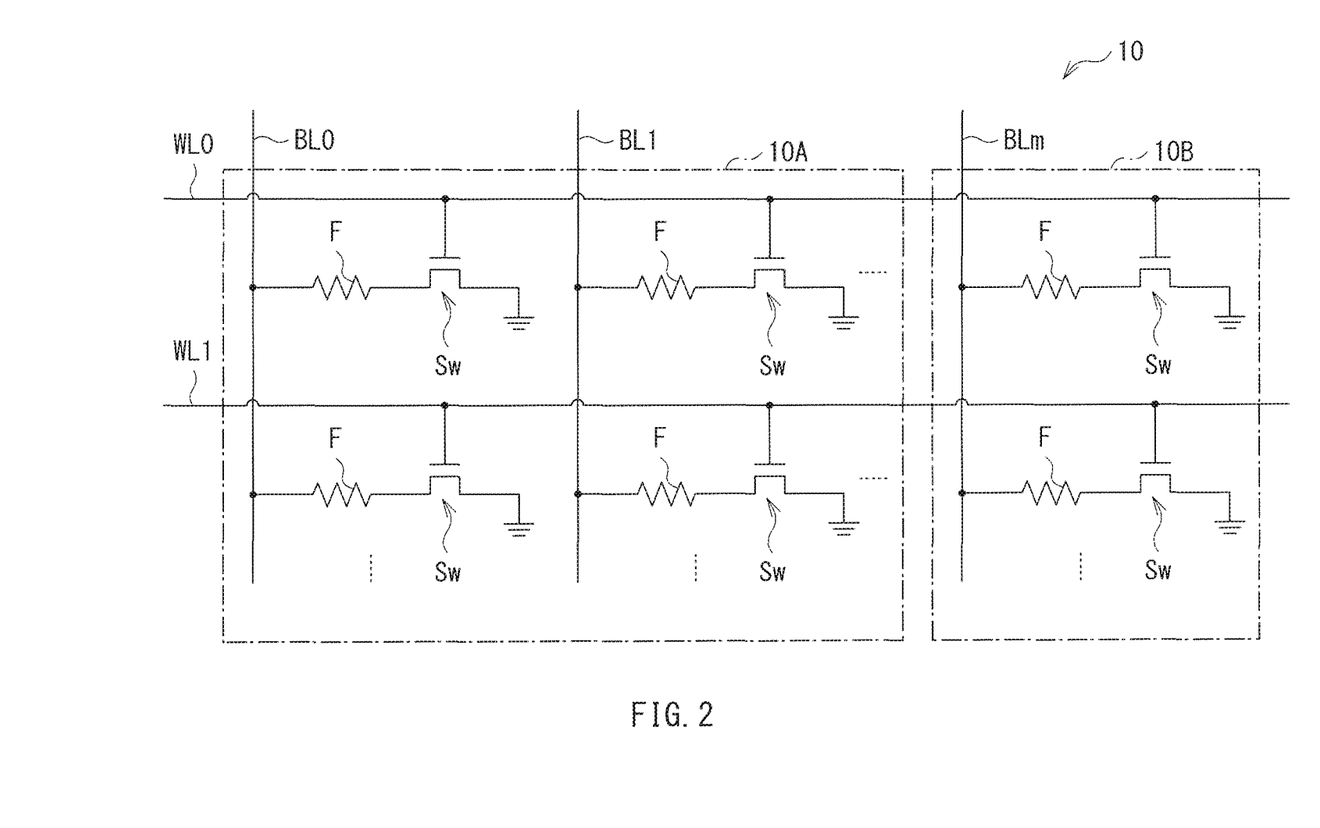
FIG. 2 is a diagram illustrating an example of a circuit configuration of an electric fuse circuit.

FIG. 2 illustrates an example of a circuit configuration of the electric fuse circuit 10. The electric fuse circuit 10 stores data by irreversibly varying element characteristics of an electric fuse F. Due to such properties, data is programmable in the electric fuse circuit 10 only once, and the electric fuse circuit 10 is therefore called an OTP memory. The electric fuse F may be, for example, a semiconductor element having a MOS structure. In the electric fuse circuit 10, application of a necessary current to the electric fuse F may cause, for example, EM (Electro Migration) of polysilicon silicide or dissolution of polysilicon. As a result, a resistance value is varied and data is thus stored in a non-volatile manner. The electric fuse circuit 10 is typically used assuming that data of "0" is stored in the electric fuse F before EM that has low resistance, and data of "1" is stored in the electric fuse F after EM that has high resistance.

As illustrated in FIG. 2, the electric fuse circuit 10 may include, for example, a data region 10A and a polarity region 10B. The data region 10A is a region in which all write data Daw inputted from outside is written as bit information. The polarity region 10B is a region in which polarity data generated in an inversion section 23 described later is written as bit information.

The electric fuse circuit 10 includes, in the data region 10A, a plurality of electric fuses F that are used as data bits. The plurality of electric fuses F (the data bits) in the data region 10A are arranged in a matrix. The electric fuse circuit 10 includes, in the polarity region 10B, a plurality of fuses F that are used as polarity bits. The plurality of electric fuses F (the polarity bits) in the polarity region 10B are arranged in one column in a column direction. Also, each one of the plurality of electric fuses F (the polarity bits) in the polarity region 10B is allocated to each row of the plurality of electric fuses F (the data bits) that are arranged in a matrix in the data region 10A.

The electric fuse circuit 10 may include, for example, a plurality of word lines WL (WL0, WL1, . . . ) that extend in a row direction, and a plurality of bit lines BL (BL0, BL1, . . . , BLm) that extend in the column direction. Each one of the plurality of word lines WL may be allocated, for example, to each row of the plurality of electric fuses F that are arranged in a matrix. Each one of the plurality of bit lines BL may be allocated, for example, to each column of the plurality of electric fuses F that are arranged in a matrix.

Each one of the electric fuses F may be arranged, for example, near a portion where the word line WL and the bit line BL intersect each other. The electric fuse circuit 10 may further include, for example, switch elements Sw each one of which is provided for each of the electric fuses F. The switch element Sw may be configured, for example, of a MOS transistor. In this case, a gate of the switch element Sw is connected to the word line WL, a source thereof is connected to the electric fuse, and a drain thereof is connected to a common potential line (for example, a ground line). Each of the electric fuses F has one end that is connected to the bit line BL, and another end that is connected to the switch element Sw.
[Write Circuit 20]

The write circuit 20 selectively passes a current through the plurality of electric fuses F arranged in a matrix, and thereby writes data in the electric fuse circuit 10. Specifically, the write circuit 20 selectively passes a current through the word line WL and the plurality of bit lines BL, and thereby performs a writing operation on the plurality of electric fuses F one by one. The write circuit 20 performs a first process when the number of write bits included in write data Dwi described later is larger than (the total number m of bits in the write data Dwi)/2. The write circuit 20 performs a second process when the number of write bits included in the write data Dwi is not larger than (the total number m of bits in the write data Dwi)/2. Further, the write circuit 20 performs a division process.

The first process includes a first write process and a second write process. The first write process refers to a process of writing inverted write data Dwi' in a plurality of electric fuses F that are part of the plurality of electric fuses F (the data bits) included in the electric fuse circuit 10. The inverted write data Dwi' is inverted data of the write data Dwi. The second write process refers to a process of writing, as polarity data, inversion data Dpi' that represents inversion in one of the electric fuses F (the polarity bits) included in the electric fuse circuit 10.

The second process includes a third write process and a fourth write process. The third write process refers to a process of writing the write data Dwi in a plurality of electric fuses F that are part of the plurality of electric fuses F (the data bits) included in the electric fuse circuit 10. The fourth write process refers to a process of writing, as polarity data, non-inversion data Dpi that represents non-inversion in one electric fuse F (polarity bit) included in the electric fuse circuit 10. It is to be noted that the wording "write, as polarity data, non-inversion data Dpi that represents non-inversion" refers to not writing, as the polarity data, the inversion data Dpi' in the electric fuse F. The wording "write, as polarity data, non-inversion data Dpi that represents non-inversion" specifically refers to not passing a current that varies the resistance value through the electric fuse F (in other words, not performing a writing operation).

The division process refers to a process of dividing the all write data Daw into a plurality of pieces of write data Dwi, and performing one of the first and second processes on each of the pieces of write data Dwi. The all write data Daw may be, for example, setting data in a semiconductor integrated circuit 100 described later (see FIG. 9). It is to be noted that, regarding the setting data to be written in the electric fuse circuit 10 that uses the electric fuses F, it is not usually assumed that data of "1" representing some kind of change in the initial setting occupies 80% or 90% of the setting data. The write data Dwi is data obtained by dividing the all write data Daw based on the number of the electric fuses F (the data bits) included in one row (1WL) as a division unit. In this case, "i" in Dwi is the number that is 1 or larger and k or smaller. It is to be noted that "i" in other symbols also represents the number that is 1 or larger and k or smaller herein. "k" is the number of division of the all write data Daw. Specifically, the write circuit 20 divides the all write data Daw into a plurality of pieces of write data Dwi based on the number of the electric fuses F (the data bits) included in one row (1WL) as a division unit.

As illustrated in FIG. 1, the write circuit 20 may include, for example, a division section 21, a counter section 22, an inversion section 23, and a write section 24, in order to perform the first process, the second process, and the division process.

The division section 21 divides the all write data Daw inputted from the outside into a plurality of pieces of write data Dwi. Specifically, the division section 21 divides the all write data Daw inputted from the outside into k-pieces of write data Dwi based on the number of the electric fuses F (the data bits) included in one row (1WL) as a division unit. Further, the division section 21 sequentially outputs the plurality of pieces of write data Dwi obtained by the division one by one to the counter section 22 and the inversion section 23.

The counter section 22 counts the number of write bits included in the write data Dwi inputted from the division section 21, and outputs the count result (count number a). The write bits refers to a bit that instructs the write section 24 to cause the electric fuse F to have high resistance by passing a current through the electric fuse F. In the present embodiment, the write bit is "1".

Figure 3:
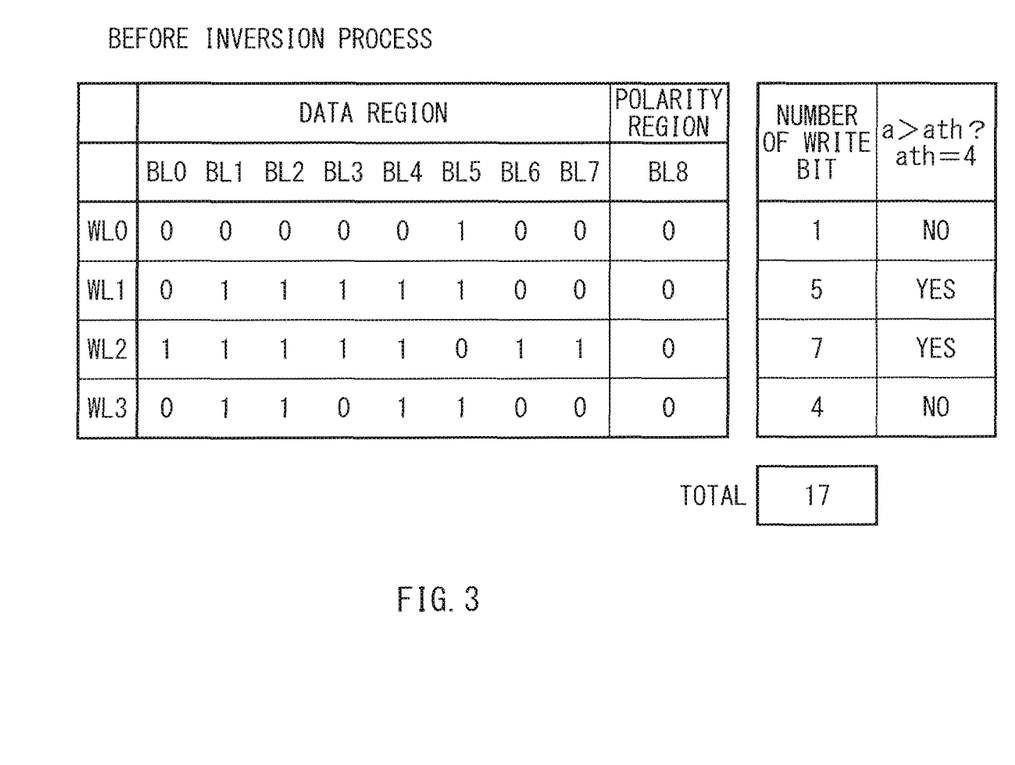
FIG. 3 is a diagram illustrating an example of all write data before an inversion process.

FIG. 3 illustrates an example of the all write data Daw before the inversion process. FIG. 3 illustrates, as an example, a case in which the all write data Daw is 32 bits, and the all write bit Daw is divided into four pieces of write data Dwi based on the number of the electric fuses F (the data bits) included in one row (1WL) as a division unit. It is to be noted that, in FIG. 3, each of the polarity bits is 0 because it is before the inversion process.

The counter section 22 counts the number of write bits included in write data Dw1 of the word line WL0, and outputs 1 as the count number a. The counter section 22 counts the number of write bits included in write data Dw2 of the word line WL1, and outputs 5 as the count number a. The counter section 22 counts the number of write bits included in write data Dw3 of the word line WL2, and outputs 7 as the count number a. The counter section 22 counts the number of write bits included in write data Dw4 of the word line WL3, and outputs 4 as the count number a. It is to be noted that the number of write bits included in the all write data Daw is 1+5+7+4=17.

The inversion section 23 first determines whether or not the number (the count number a) of the write bits inputted from the counter section 22 is larger than a threshold ath. When the number (the count number a) of the write bits is larger than the threshold ath as a result, the inversion section 23 performs the above-described first process, and outputs the write data Di to the write section 24. At this time, the write data Di includes the inverted write data Dwi' and the inversion data Dpi'. The threshold ath is (the total number m of bits of the write data Dwi)/2. When the number (the count number a) of the write bits is not larger than the threshold ath, the inversion section 23 performs the above-described second process, and outputs the write data Di to the write section 24. At this time, the write data Di includes the write data Dwi and the non-inversion data Dpi. The inversion section 23 may include, for example, an inverter circuit in order to perform the inversion process.

Figure 4:
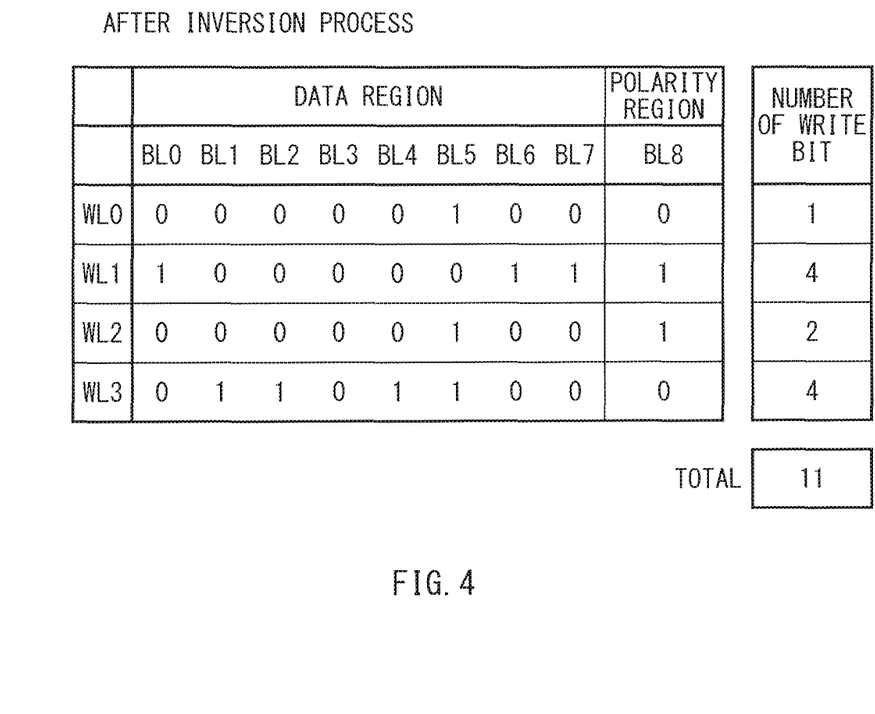
FIG. 4 is a diagram illustrating an example of the all write data after the inversion process.

FIG. 4 illustrates an example of the all write data Daw after the inversion process. The count number a of the word line WL0 in FIG. 3 is not larger than the threshold ath. The inversion section 23 therefore performs the second process on the write data Dw1 of the word line WL0, and outputs, to the write section 24, the write data Dw1 of the word line WL0 in FIG. 4 and non-inversion data Dp1 as write data D1. The count number a of the word line WL1 in FIG. 3 is larger than the threshold ath. The inversion section 23 therefore performs the first process on the write data Dw2 of the word line WL1, and outputs, to the write section 24, inverted write data Dw2' of the word line WL1 in FIG. 4 and inversion data Dp2' as write data D2. The count number a of the word line WL2 in FIG. 3 is larger than the threshold ath. The inversion section 23 therefore performs the first process on the write data Dw3 of the word line WL2, and outputs, to the write section 24, inverted write data Dw3' of the word line WL2 in FIG. 4 and inversion data Dp3' as write data D3. The count number a of the word line WL3 in FIG. 3 is not larger than the threshold ath. The inversion section 23 therefore performs the second process on the write data Dw4 of the word line WL3, and outputs the write data Dw4 of the word line WL3 in FIG. 4 and non-inversion data Dp4 as write data D4.

It is to be noted that the number of the write bits included in the write data D1 is 1. The number of the write bits included in the write data D2 is 4. The number of the write bits included in the write data D3 is 2. The number of the write bits included in the write data D4 is 4. Accordingly, the number of the write bits after performing the inversion process on the all write data Daw is 11, which is smaller than the number (17) of the write bits of the all write data Daw before the inversion process.

The write section 24 writes the write data Di inputted from the inversion section 23 in the electric fuse circuit 10. Specifically, the write section 24 selectively passes a current through the plurality of word lines WL and the plurality of bit lines BL based on the write data Di inputted from the inversion section 23, and thereby performs writing operations on the plurality of electric fuses F one by one.

[Read Circuit 30]

The read circuit 30 reads data written in the electric fuse circuit 10. As illustrated in FIG. 1, the read circuit 30 may include, for example, a read section 31, a polarity determination section 32, and an inversion section 33.

The read section 31 reads data written in the electric fuse circuit 10 by detecting whether or not a potential at a predetermined location is larger than the threshold when a current is selectively passed through the plurality of electric fuses F arranged in a matrix. The read section 31 reads the data bits in the data region 10A, and also reads the polarity bit allocated to the data bits to be read. The read section 31 outputs the read data bits to the inversion section 33, and outputs the read polarity bits to the polarity determination section 32.

The polarity determination section 32 determines, based on the polarity bit inputted to the read section 31, whether or not the data bits corresponding to the inputted polarity bit are inverted bits. When the polarity bit inputted from the read section 31 is "1", the polarity determination section 32 determines that the data bits corresponding to the inputted polarity bit are inverted bits, and outputs the determination result to the inversion section 33. When the polarity bit inputted from the read section 31 is "0", the polarity determination section 32 determines that the data bits corresponding to the inputted polarity bit are not inverted bits, and outputs the determination result to the inversion section 33.

When the determination result inputted from the polarity determination section 32 shows that "the data bits are inverted bits", the inverted section 33 performs the inversion process on the data bits inputted from the read section 31, and outputs the resultant as read data Dxy. When the determination result inputted from the polarity determination section 32 shows that "the data bits are not inverted bits", the inversion section 33 outputs, as the read data Dxy, the data bits inputted from the read section 31. The inversion section 33 may include, for example, an inverter circuit in order to perform the inversion process.

[Procedure of Writing Data]

Figure 5:
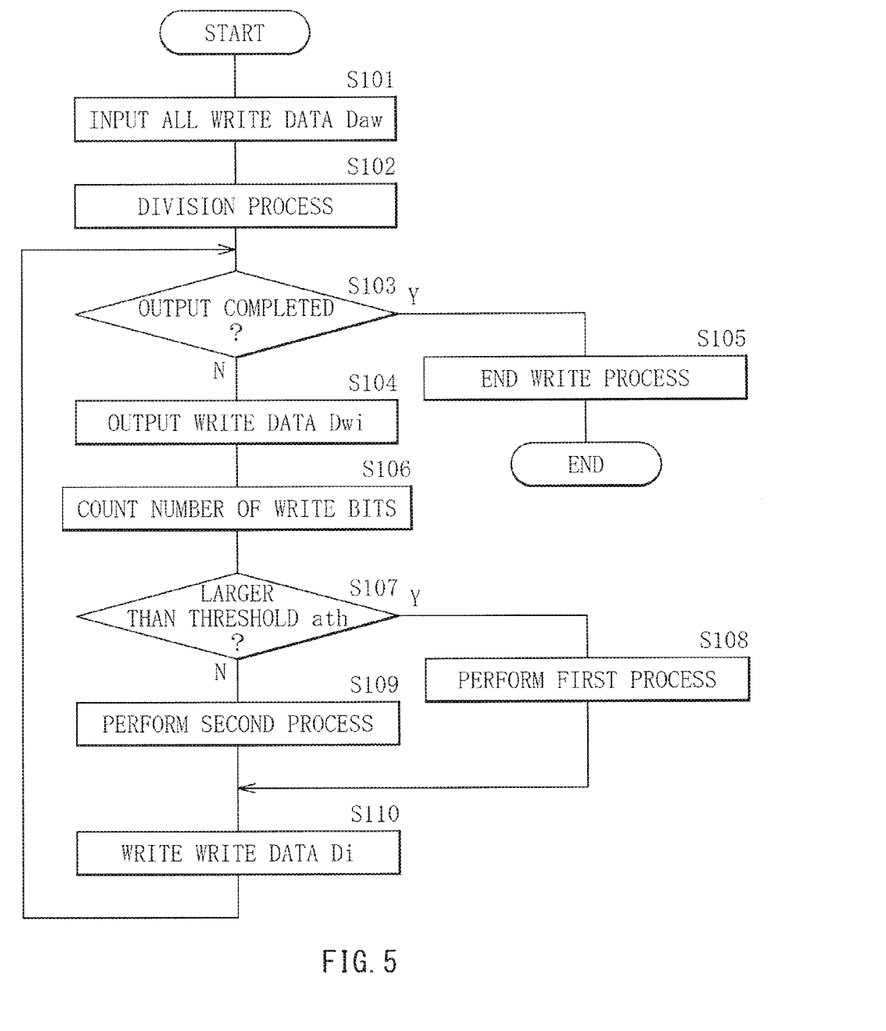
FIG. 5 is a diagram illustrating an example of a data writing procedure that uses the semiconductor device illustrated in FIG. 1.

Next, description is provided of a procedure of writing data with the use of the semiconductor device 1 of the present embodiment. FIG. 5 illustrates an example of the procedure of writing data with the use of the semiconductor device 1. First, an external unit (not illustrated) inputs the all write data Daw to the semiconductor device 1 (step S101). In response thereto, the division section 21 performs the division process on the all write data Daw (step S102). The division section 21 divides the all write data Daw inputted from the outside into a plurality of pieces of write data Dwi. Specifically, the division section 21 divides the all write data Daw into the plurality of pieces of write data Dwi based on the number of the electric fuses F (the data bits) included in one row (1WL) as a division unit. Thereafter, the division section 21 sequentially outputs the plurality of pieces of write data Dwi obtained as a result of the division to the counter section 22 and the inversion section 23 one by one. The division section 21 determines whether or not all of the pieces of write data Dwi are completely outputted to the counter section 22 and the inversion section 23 (step S103). As a result, when not all of the pieces of write data Dwi are completely outputted, the division section 21 outputs next piece of write data Dwi to the counter section 22 and the inversion section 23 (step S104). When all of the pieces of write data Dwi are completely outputted, the division section 21 ends the process of writing data (step S105).

Next, the counter section 22 counts the number of write bits included in the write data Dwi inputted from the division section 21 (step S106). Further, the counter section 22 outputs the count result (the count number a) to the inversion section 23. The inversion section 23 determines whether or not the number (the count number a) of the write bits inputted from the counter section 22 is larger than the threshold ath (step S107). As a result, when the number (the count number a) of the write bits is larger than the threshold ath, the inversion section 23 performs the first process (step S108). Further, the inversion section 23 outputs the write data Di to the write section 24. When the number (the count number a) of the write bits is not larger than the threshold ath, the inversion section 23 performs the second process (step S109). Further, the inversion section 23 outputs, to the write section 24, the write data Di generated as a result of execution of the first and second processes.

The write section 24 writes the write data Di inputted from the inversion section 23 in the electric fuse circuit 10 (step S110). The write section 24 selectively passes a current through the plurality of word lines WL and the plurality of bit lines BL based on the write data Di inputted from the inversion section 23, and thereby performs writing operations on the plurality of electric fuses F one by one. Specifically, the write section 24 selectively passes a current through a plurality of electric fuses F that are included as part of the plurality of fuses F in the data region 10A, and thereby writes the write data Dwi or the inverted write data Dwi'. In this case, the plurality of electric fuses F that are included as part of the plurality of fuses F in the data region 10A may refer, for example, to a plurality of electric fuses F in the data region 10A included in 1WL. Further, the write section 24 passes a current through one electric fuse F included in the plurality of fuses F in the polarity region 10B, and thereby writes the non-inversion data Dpi or the inversion data Dpi'. In this case, the one electric fuse F included in the plurality of fuses F in the polarity region 10B may refer, for example, to one electric fuse F in the polarity region 10B included in 1WL.

Thereafter, every time the write data Dwi is inputted from the division section 21 in a sequential manner, the counter section 22 counts the number of write bits included in the write data Dwi, and outputs the count result (the count number a) to the inversion section 23. Every time the number (the count number a) of the write bits is inputted from the counter section 22 in a sequential manner, the inversion section 23 determines whether or not the number (the count number a) of the write bits is larger than the threshold ath. Further, the inversion section 23 executes one of the first and second processes based on the determination result, and outputs the write data Di to the inversion section 23. Every time the write data Di is inputted from the inversion section 23, the write section 24 shifts a row to be written by one row and writes the write data Di in the electric fuse circuit 10. The process of writing data is ended at last when all of the pieces of write data Dwi are completely outputted as described above.

Effects

Next, effects of the semiconductor device 1 of the present embodiment are described.

Figure 6:
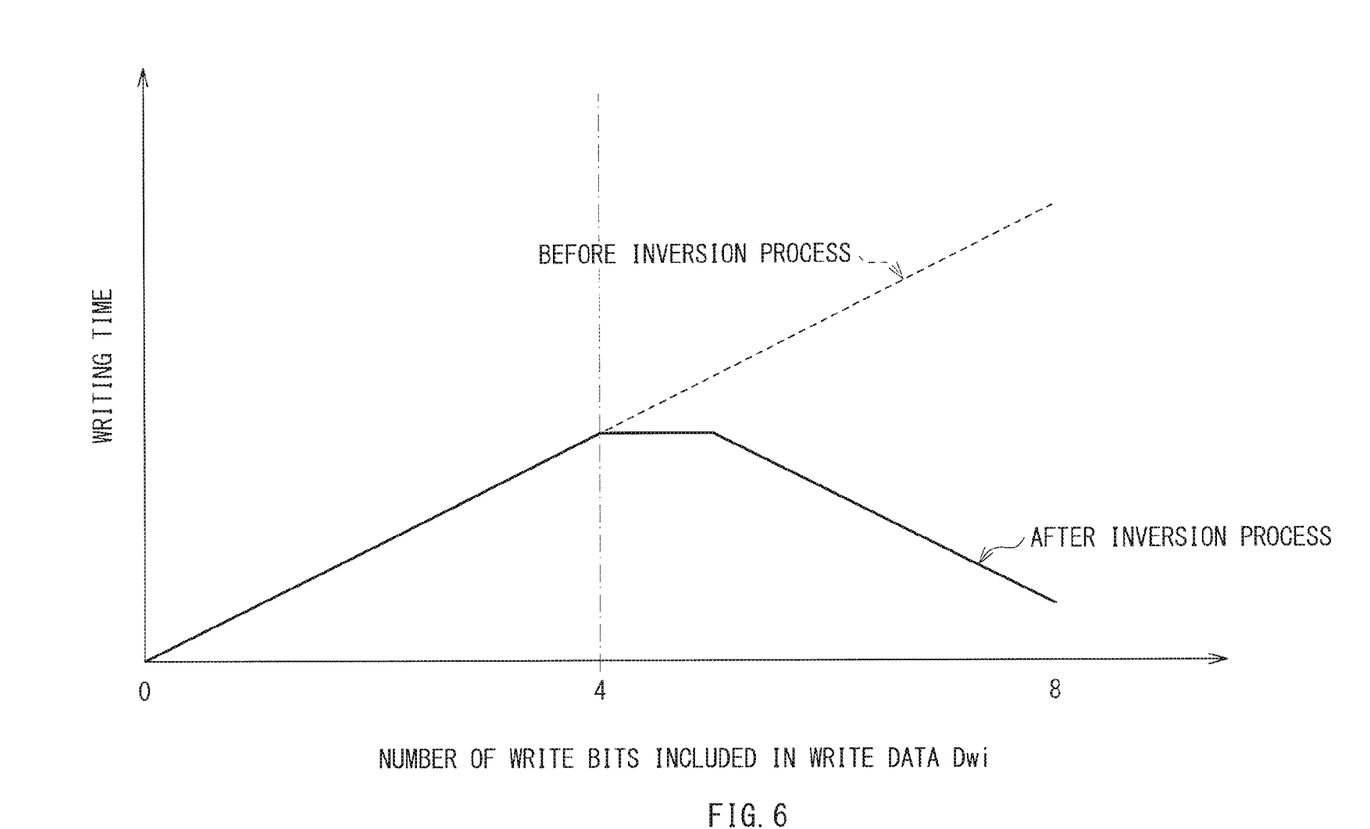
FIG. 6 is a diagram illustrating writing time before and after the inversion process on write data.

FIG. 6 illustrates writing time before and after the inversion process on the write data Dwi. A horizontal axis in FIG. 6 shows the number of write bits included in the write data Dwi. A vertical axis in FIG. 6 shows writing time. In FIG. 6, the number of data bits included in the write data Dwi is 8. Before the inversion process, the writing time of the write data Di is increased in proportion to increase in the number of the write bits included in the write data Dwi. After the inversion process, when the number of the write bits included in the write data Dwi is from 0 to 4, the writing time is increased in proportion to increase in the number of the write bits included in the write data Dwi. However, when the number of the write bits included in the write data Dwi is from 4 to 8, the writing time of the write data Di is not varied or decreased although the number of the write bits included in the write data Dwi increases. As described above, in the present embodiment, it is possible to perform a writing operation on the electric fuse circuit 10 in time same as or less than the writing time in a case of not performing the inversion process.

Figure 7:
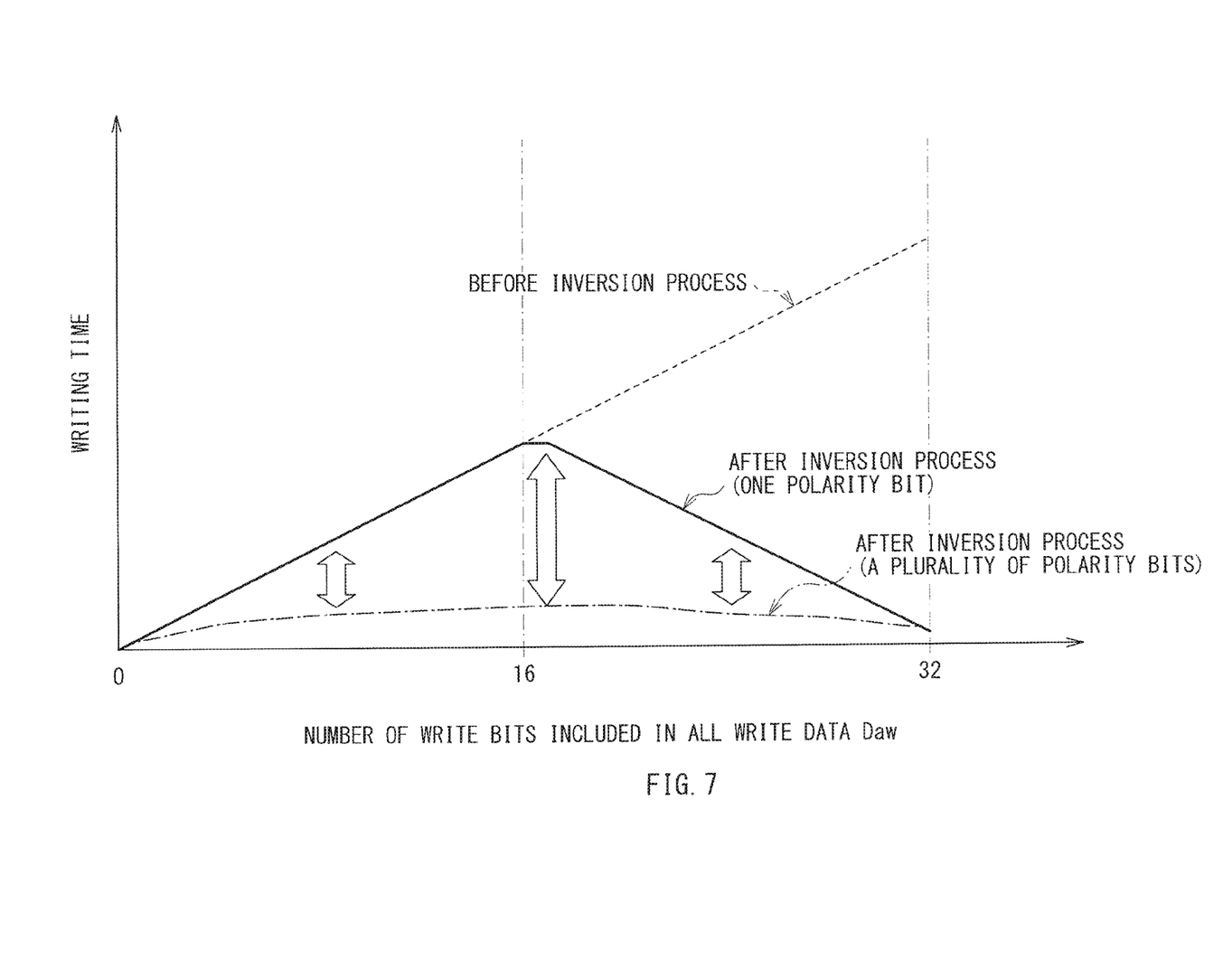
FIG. 7 is a diagram illustrating writing time before and after the inversion process on the all write data.

FIG. 7 illustrates writing time before and after the inversion process on the all write data Daw. FIG. 7 illustrates, as an example, writing time in a case where the inversion process is performed with the use of one polarity bit and writing time in a case where the inversion process is performed with the use of a plurality of polarity bits. It is to be noted that the writing time in the case where the inversion process is performed with the use of the plurality of polarity bits in FIG. 7 is a mere example, and does not show that it is always the case. A horizontal axis in FIG. 7 shows the number of write bits included in the all write data Daw. A vertical axis in FIG. 7 shows writing time. In FIG. 7, the number of the data bits included in the write data Dwi is 8. The writing time in the case where the inversion process is performed with the use of the plurality of polarity bits is less than the writing time in the case where the inversion process is performed with the use of only one polarity bit. As can be seen therefrom, in the present embodiment, it is possible to perform the writing operation on the electric fuse circuit 10 in writing time less than the writing time in the case where the inversion process is performed with the use of only one polarity bit.

As described above, in the present embodiment, it is possible to reduce the data writing time compared to that in the case where polarity inversion is not performed. Further, even in a case where the polarity inversion is performed, it is possible to reduce the data writing time compared to the case where only one polarity bit is provided in the electric fuse circuit. As a result, it is possible to suppress increase in data writing time.

Moreover, in the present embodiment, one polarity bit is allocated to a plurality of data bits that are part of the plurality of data bits in the electric fuse circuit 10. It is therefore possible to improve secrecy of data.

[Supplemental Remarks]

As described above, it is not usually assumed that data of "1" representing some kind of change in initial setting occupies 80% or 90% of the all write data Daw which is to be written in the electric fuse circuit 10 that uses the electric fuse F. However, the case where the ratio of "1" occupying the all write data Daw is extremely high is theoretically possible. Accordingly, when considering theoretically, the all write data Daw may be preferably written in the electric fuse circuit 10 with the use of the semiconductor device 1 in the above-described embodiment only when the all write data Daw matches the following conditions.

[Condition 1]

The all write data Daw may be preferably written in the electric fuse circuit 10 with the use of the semiconductor device 1 in the above-described embodiment when the number of the bit lines and the number of the word lines satisfy the following Relational expression (1), the following Relational expression (2) is satisfied in at least 1WL in the all write data Daw, and the following Relational expression (3) is further satisfied in at least 1WL in the one or more WLs that satisfy the following Relational expression (2).

$$\text{The number of bit lines} \geq \text{The number of word lines} \quad (1)$$

$$\text{The number of write bits included in the write data } Dwi \leq (\text{The total number } m \text{ of bits in the write data } Dwi)/2 \quad (2)$$

$$\text{The number of write bits} \leq (\text{The number of bit lines} - \text{The number of word lines} + 2)/2 \quad (3)$$

[Condition 2]

The all write data Daw may be preferably written in the electric fuse circuit 10 with the use of the semiconductor device 1 in the above-described embodiment when the number of the bit lines and the number of the word lines satisfy the following Relational expression (4), the foregoing Relational expression (2) is satisfied in at least "X"WL (or "X"WLs) in the all write data Daw, and the following Relational expression (5) is further satisfied in at least "X"WL (or "X"WLs) as a whole in the one or more WLs that satisfy the foregoing Relational expression (2). It is to be noted that "X" is a positive integer and is derived from the following Expression (6).

$$\text{The number of bit lines} < \text{The number of word lines} \quad (4)$$

$$\text{The number of write bits} \leq 1 \quad (5)$$

$$X = (\text{The number of word lines/The number of bit lines}) \text{ where the value is rounded down to an integer} \quad (6)$$

2. Modification

Next, a modification of the semiconductor device 1 in the above-described embodiment is described. It is to be noted that, hereinafter, the same symbols are used to designate components common to those in the semiconductor device 1 in the above-described embodiment, and the description thereof is appropriately omitted.

Figure 8:
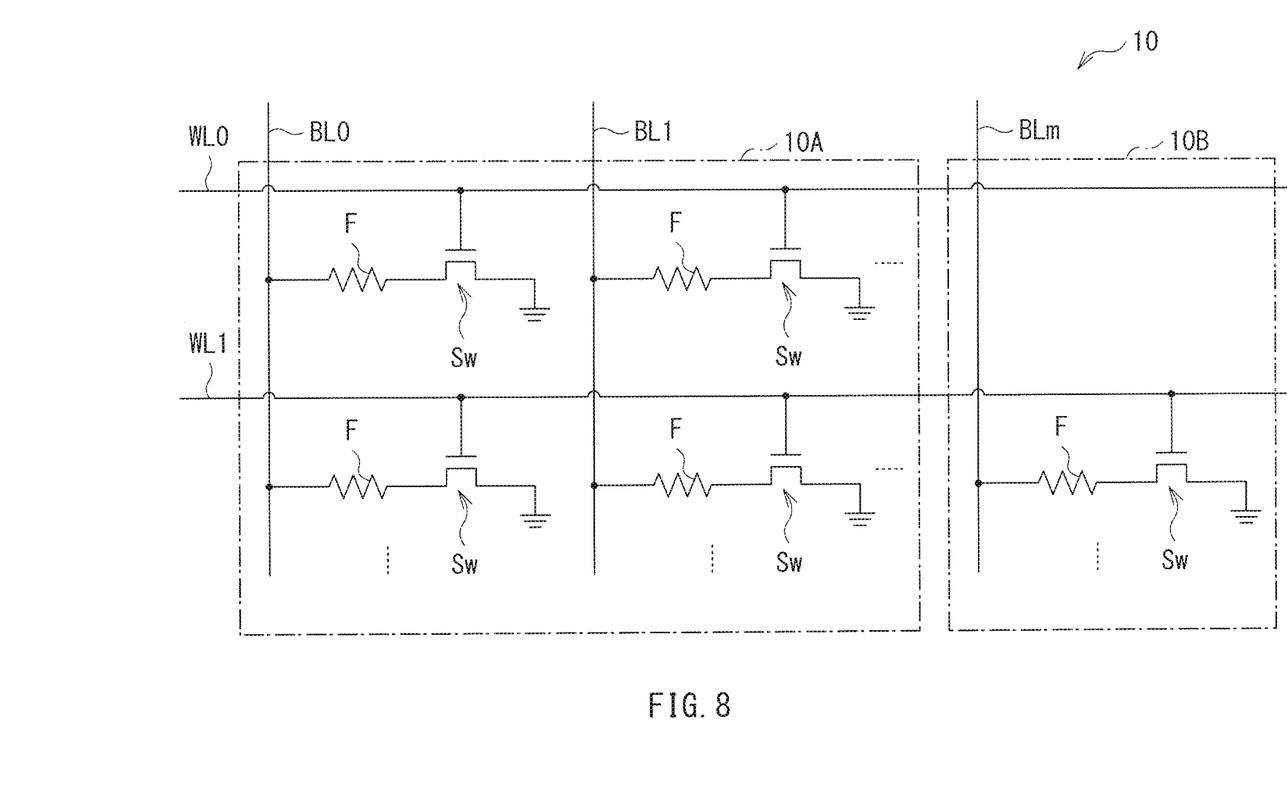
FIG. 8 is a diagram illustrating a modification of the circuit configuration of the electric fuse circuit illustrated in FIG. 2.

In the above-described embodiment, each one of the plurality of electric fuses F that are used as inversion bits is allocated to each row of the plurality of electric fuses F (the data bits) arranged in a matrix. However, for example, as illustrated in FIG. 8, each of the plurality of electric fuses F that are used as the inversion bits may be allocated to each plurality of rows of the plurality of electric fuses F (the data bits) that are arranged in a matrix.

3. Application Example

Figure 9:
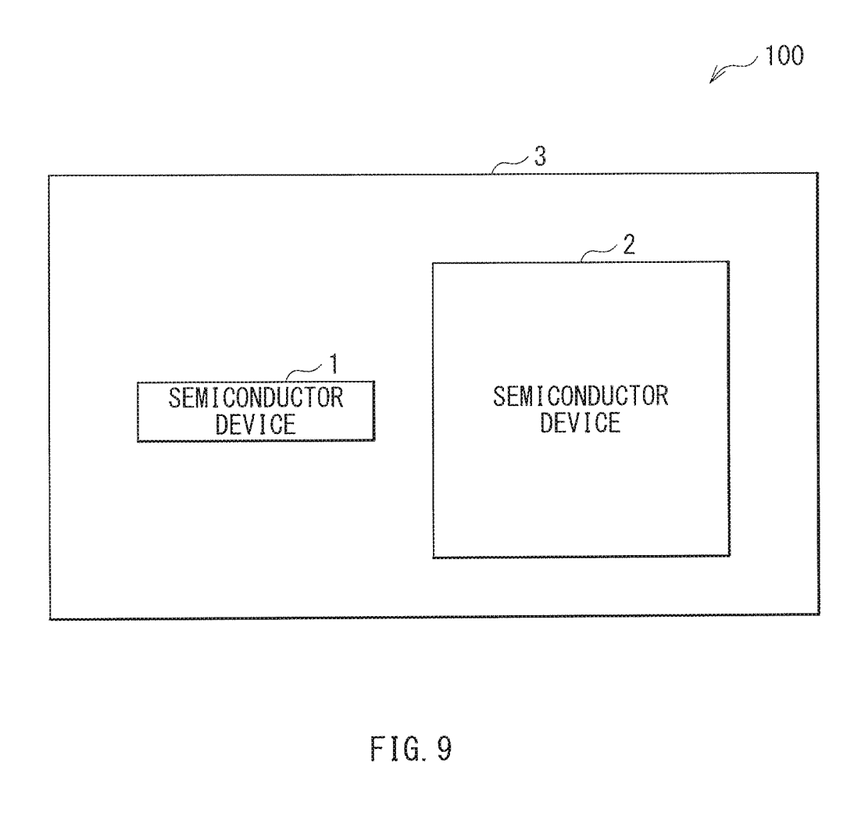
FIG. 9 is an outline configuration diagram illustrating an application example of the semiconductor device.

Next, an application example of the semiconductor device 1 in the above-described embodiment and the modification thereof is described. FIG. 9 illustrates an example of an outline configuration of a semiconductor integrated circuit 100 according to an application example. The semiconductor integrated circuit 100 may include, for example, the semiconductor device 1 in the above-described embodiment or the modification thereof, a semiconductor device 2, and a support member 3 that supports the semiconductor devices 1 and 2. The semiconductor device 2 may be, for example, a logic circuit, an integrated memory circuit, or the like. The support member 3 may be, for example, a semiconductor substrate that is used when forming the semiconductor devices 1 and 2.

The present technology has been described above referring to the embodiment, the modification thereof, and the application example. However, the present technology is not limited to the embodiment and the like described above, and may be variously modified. It is to be noted that the effects described herein are mere examples. The effects of the present technology are not limited to the effects described herein. The present technology may have an effect other than the effects described herein.

For example, in the embodiment and the like described above, all of the functions of the write circuit 20 and the read circuit 30 may be achieved by hardware (a circuit), or may be achieved by a mixture of hardware and software (a program).

It is possible to achieve at least the following configurations from the above-described example embodiment and the modifications of the present technology.

(1) A semiconductor device including:

an electric fuse circuit including a first plurality of first electric fuses and a plurality of second electric fuses, the first plurality of first electric fuses being configured to be used as data bits, and the plurality of second electric fuses being used as polarity bits; and a write circuit configured to selectively pass a current through the first plurality of first electric fuses and the plurality of second electric fuses and thereby write data in the electric fuse circuit, the write circuit being configured to perform a first process when number of write bits included in write data is larger than a value obtained by dividing total number of bits in the write data by 2, the first process including writing of inverted write data in a second plurality of first electric fuses, and including writing of inversion data in one of the plurality of second electric fuses included in the electric fuse circuit, the second plurality of first electric fuses being part of the first plurality of first electric fuses included in the electric fuse circuit, the inverted write data being inverted data of the write data, and the inversion data representing inversion.

(2) The semiconductor device according to (1), wherein the write circuit performs a second process when the number of the write bits included in the write data is larger than the value obtained by dividing the total number of the bits in the write data by 2, the second process including writing the write data in a third plurality of first electric fuses and including writing non-inversion data in one of the plurality of second electric fuses included in the electric fuse circuit, the third plurality of first electric fuses being part of the first plurality of first electric fuses included in the electric fuse circuit, and the non-inversion data representing non-inversion.

(3) The semiconductor device according to (1) or (2), wherein the write circuit divides all write data into a plurality of pieces of the write data, and performs one of the first process and the second process on each of the plurality of pieces of the write data.

(4) The semiconductor device according to (3), wherein the first plurality of first electric fuses are arranged in a matrix, the plurality of second electric fuses are arranged in one column in a column direction, and are each allocated to one row of the first plurality of first electric fuses arranged in the matrix, and the write circuit divides the all write data into the plurality of pieces of the write data based on number of the first electric fuses included in one row as a division unit.

(5) The semiconductor device according to any one of (1) to (4), wherein the electric fuse circuit includes a plurality of word lines and a plurality of bit lines, the plurality of word lines extending in a row direction and each being allocated to one row of the first plurality of first electric fuses arranged in the matrix and the plurality of second electric fuses arranged in the one column in the column direction, and the plurality of bit lines extending in the column direction and each being allocated to one column of the first plurality of first electric fuses arranged in the matrix and the plurality of second electric fuses arranged in the one column in the column direction, and the write circuit selectively passes a current through the plurality of word lines and the plurality of bit lines and thereby performs a writing operation on the first plurality of first electric fuses and the plurality of second electric fuses one by one.

(6) A method of writing data, the method including when number of write bits included in write data is larger than a value obtained by dividing total number of bits in the write data by 2, selectively passing a current through a second plurality of first electric fuses and thereby writing inverted write data in the second plurality of first electric fuses, as well as passing a current through one of a plurality of second electric fuses and thereby writing inversion data in the one of the plurality of second electric fuses, the second plurality of first electric fuses being part of a first plurality of first electric fuses, the first plurality of first electric fuses and the plurality of second electric fuses being included in an electric fuse circuit, the first plurality of first electric fuses being configured to be used as data bits, the plurality of second electric fuses being configured to be used as polarity bits, the inverted write data being inverted data of the write data, and the inversion data representing inversion.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device comprising:

an electric fuse circuit including a first plurality of first electric fuses arranged in a matrix and a plurality of second electric fuses arranged in one column in a column direction and each allocated to one or a plurality of rows of the first plurality of first electric fuses arranged in the matrix, the first plurality of first electric fuses being configured to be used as data bits, and the plurality of second electric fuses being used as polarity bits; and a write circuit configured to selectively pass a first current through the first plurality of first electric fuses and the plurality of second electric fuses and thereby write data in the electric fuse circuit, the write circuit being configured to divide all write data into a plurality of pieces of the write data based on a number of the first electric fuses included in the one or the plurality of rows as a division unit, and to perform one of a first process and a second process on each of the plurality of pieces of the write data, the write circuit being configured to perform the first process when a number of write bits included in the write data is larger than a value obtained by dividing a total number of bits in the write data by 2 and to perform the second process when the number of the write bits included in the write data is not larger than the value obtained by dividing the total number of the bits in the write data by 2, the first process including writing of an inverted write data in a second plurality of first electric fuses, and including writing of an inversion data in one of the plurality of second electric fuses included in the electric fuse circuit, the second plurality of first electric fuses being part of the first plurality of first electric fuses included in the electric fuse circuit, the inverted write data being inverted data of the write data, and the inversion data representing inversion, the second process including writing the write data in a third plurality of first electric fuses and including writing non-inversion data in one of the plurality of second electric fuses included in the electric fuse circuit, the third plurality of first electric fuses being part of the first plurality of first electric fuses included in the electric fuse circuit, and the non-inversion data representing non-inversion.

2. The semiconductor device according to claim 1, wherein the plurality of second electric fuses are each allocated to one row of the first plurality of first electric fuses arranged in the matrix, and the write circuit divides the all write data into the plurality of pieces of the write data based on the number of the first electric fuses included in one row as the division unit.

3. The semiconductor device according to claim 2, wherein the electric fuse circuit includes a plurality of word lines and a plurality of bit lines, the plurality of word lines extending in a row direction and each being allocated to one row of the first plurality of first electric fuses arranged in the matrix and the plurality of second electric fuses arranged in the one column in the column direction, and the plurality of bit lines extending in the column direction and each being allocated to one column of the first plurality of first electric fuses arranged in the matrix and the plurality of second electric fuses arranged in the one column in the column direction, and the write circuit selectively passes the first current through the plurality of word lines and the plurality of bit lines and thereby performs a writing operation on the first plurality of first electric fuses and the plurality of second electric fuses one by one.

4. A method of writing data in a semiconductor device comprising an electric fuse circuit including a first plurality of first electric fuses arranged in a matrix and a plurality of second electric fuses arranged in one column in a column direction and each allocated to one or a plurality of rows of the first plurality of first electric fuses arranged in the matrix, the first plurality of first electric fuses being configured to be used as data bits, and the plurality of second electric fuses being used as polarity bits; and a write circuit configured to selectively pass a first current through the first plurality of first electric fuses and the plurality of second electric fuses and thereby write data in the electric fuse circuit, the method comprising:

dividing all write data into a plurality of pieces of the write data based on a number of the first electric fuses included in the one or the plurality of rows as a division unit, and performing one of a first process and a second process on each of the plurality of pieces of the write data; and when a number of write bits included in the write data is larger than a value obtained by dividing a total number of bits in the write data by 2, performing the first process including:

selectively passing a first current through the second plurality of first electric fuses and thereby writing an inverted write data in the second plurality of first electric fuses, as well as passing the first current through one of a plurality of second electric fuses and thereby writing an inversion data in the one of the plurality of second electric fuses, the second plurality of first electric fuses being part of a first plurality of first electric fuses, the inverted write data being inverted data of the write data, and the inversion data representing inversion; and when the number of write bits included in the write data is not than the value obtained by dividing the total number of the bits in the write data by 2, performing the second process including:

selectively passing the first current through a third plurality of the first electric fuses and thereby writing the write data in the third plurality of first electric fuses, as well as passing the first current though one of the plurality of second electric fuses and thereby writing non-inversion data in the one of the plurality of second electric fuses, the third plurality of first electric fuses being part of the first plurality of first electric fuses included in the electric fuse circuit, and the non-inversion data representing non-inversion.

5. The semiconductor device according to claim 1, wherein the first current has a value sufficient to vary a resistance of respective ones of the second plurality of first electric fuses and respective ones of the plurality of second electric fuses.

6. The semiconductor device according to claim 1, wherein a structure of respective ones of the first plurality of first electric fuses is the same as a structure of respective ones of the plurality of second electric fuses.

7. The semiconductor device according to claim 1, further comprising:

a read circuit configured to detect whether a potential at a predetermined location is larger than a threshold when a second current is selectively passed through the electric fuse circuit, and thereby read the data in the electric fuse circuit.

8. The semiconductor device according to claim 1, wherein the plurality of second electric fuses are each allocated to the plurality of rows of the first plurality of first electric fuses arranged in the matrix, and the write circuit divides the all write data into the plurality of pieces of the write data based on the number of the first electric fuses included in the plurality of rows as the division unit.

9. The method according to claim 4, wherein the plurality of second electric fuses are each allocated to one row of the first plurality of first electric fuses arranged in the matrix, and the dividing includes dividing the all write data into the plurality of pieces of the write data based on the number of the first electric fuses included in one row as the division unit.

10. The method according to claim 4, wherein the plurality of second electric fuses are each allocated to the plurality of rows of the first plurality of first electric fuses arranged in the matrix, and the dividing includes dividing the all write data into the plurality of pieces of the write data based on the number of the first electric fuses included in the plurality of rows as the division unit.

11. The method according to claim 4, wherein the first current has a value sufficient to vary a resistance of respective ones of the second plurality of first electric fuses and respective ones of the plurality of second electric fuses.

12. The method according to claim 4, wherein a structure of respective ones of the first plurality of first electric fuses is the same as a structure of respective ones of the plurality of second electric fuses.

13. The method according to claim 4, further comprising:

detecting whether a potential at a predetermined location is larger than a threshold when a second current is selectively passed through the electric fuse circuit, and thereby reading the data in the electric fuse circuit.

* * * * *